US010297648B2

(12) United States Patent
Ma et al.

(10) Patent No.: US 10,297,648 B2
(45) Date of Patent: May 21, 2019

(54) ORGANIC LIGHT-EMITTING DIODE DISPLAY, METHOD FOR FABRICATING THE SAME, AND DISPLAY DEVICE

(71) Applicant: Xiamen Tianma Micro-Electronics Co., Ltd., Xiamen (CN)

(72) Inventors: Jun Ma, Xiamen (CN); Hanyu Gu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/786,475

(22) Filed: Oct. 17, 2017

(65) Prior Publication Data

US 2018/0342560 A1   Nov. 29, 2018

(30) Foreign Application Priority Data

May 25, 2017   (CN) .......................... 2017 1 0378715

(51) Int. Cl.
*H01L 27/32* (2006.01)
*G06F 3/044* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC . H01L 27/323; H01L 27/322; H01L 51/5203; H01L 51/5284
See application file for complete search history.

(56) References Cited

U.S. PATENT DOCUMENTS

2010/0265206 A1* 10/2010 Chen ..................... G06F 3/0412
345/174
2012/0182261 A1* 7/2012 Wang ..................... G06F 3/044
345/174
(Continued)

FOREIGN PATENT DOCUMENTS

CN          103744139 A       4/2014
CN          104885142 A1      9/2015
(Continued)

*Primary Examiner* — Phuc T Dang
(74) *Attorney, Agent, or Firm* — Alston & Bird LLP

(57) ABSTRACT

The disclosure discloses an Organic Light-Emitting Diode (OLED) display, a method for fabricating the same, and a display device, where a color filter layer is used as an insulation layer between electrically conductive layers in a touch electrode structure, so that the insulation layer and the color filter layer are the same film layer, thereby improving the integrity of the OLED display, and reducing the thickness of the OLED display. Also, the OLED display can be fabricated by forming the electrically conductive layers and the color filter layer in the touch electrode structure through inkjet printing, thereby preventing an organic light-emitting diode layer from being affected in an etching process. Therefore, at least one inorganic encapsulation layer can be arranged on a side of the touch electrode structure furthest away from the organic light-emitting structural layer to enable the touch electrode structure to be integrated in the OLED display.

18 Claims, 9 Drawing Sheets

(51) Int. Cl.
*G06F 3/041* (2006.01)
*H01L 51/52* (2006.01)

(52) U.S. Cl.
CPC ........ *H01L 27/322* (2013.01); *H01L 51/5203* (2013.01); *H01L 51/5284* (2013.01); *H01L 27/3244* (2013.01)

(56) References Cited

U.S. PATENT DOCUMENTS

| | | | | |
|---|---|---|---|---|
| 2014/0232959 | A1* | 8/2014 | Kuriki | G06F 3/044 349/12 |
| 2016/0116781 | A1* | 4/2016 | Wu | G02F 1/13394 349/12 |
| 2017/0228075 | A1* | 8/2017 | Lin | G06F 3/0412 |
| 2017/0269732 | A1* | 9/2017 | Chang | G06F 3/044 |
| 2017/0338288 | A1* | 11/2017 | Lee | G06F 3/044 |
| 2017/0358637 | A1* | 12/2017 | Lee | G06F 3/0412 |
| 2018/0088726 | A1* | 3/2018 | Gwon | G06F 3/0412 |
| 2018/0212167 | A1* | 7/2018 | Chun | H01L 51/52 |

FOREIGN PATENT DOCUMENTS

| | | |
|---|---|---|
| CN | 106449707 A1 | 2/2017 |
| KR | 20120133955 A | 12/2012 |

\* cited by examiner

ORGANIC LIGHT-EMITTING DIODE DISPLAY, METHOD FOR FABRICATING THE SAME, AND DISPLAY DEVICE

CROSS-REFERENCE TO RELATED APPLICATIONS

This application claims the priority to Chinese Patent Application No. 201710378715.4, filed on May 25, 2017, the content of which is hereby incorporated by reference in its entirety.

FIELD

The present disclosure relates to the field of display technologies, and particularly to an organic light-emitting diode display, a method for fabricating the same, and a display device.

BACKGROUND

Organic Light-Emitting Diode (OLED) displays have been widely applied to displays of smart terminals such as mobile phones, computers, and MP3 players, due to the characteristics of OLED displays such as low weight, small thickness and power saving. The light source of an OLED display is not a backlight, but very thin layers of organic light-emitting materials deposited on a glass substrate. The organic light-emitting materials include three types: red, green, and blue color; and if a current is passed through the light-emitting layers, the light-emitting layers may emit light in different colors. Since optical elements such as backlights or light-guiding plates, are dispensed with, the OLED display screen could be made lighter and thinner as well as produce a larger angle of view, and significantly save power.

At present, an array substrate of an OLED display is typically fabricated by depositing light-emitting layers on a glass substrate through vapor plating. The Red-Green-Blue (RGB) organic light-emitting layers are vapor-plated in such a way that adjacent RGB organic light-emitting layers are spaced by 18 µm to 20 µm, resulting in a low resolution of full-color image displaying on the OLED display.

SUMMARY

Hereupon, another technology of displaying a full-color image on an OLED display has been proposed, where a full-color image is displayed using a white organic light-emitting layer and a Color Filter (CF) layer. The white organic light-emitting layer covering a plurality of display elements is fabricated through vapor plating so that the spacing between adjacent display elements is not determined by the organic light-emitting layer, thus greatly narrowing the spacing between adjacent display elements.

However the CF layer has to be added to the OLED display when adopting technology of displaying a full-color image, which is restricted by the fabrication of the CF layer. In order to display a full-color image bottom-emitting OLEDs need to be fabricated, thus hindering the resolution thereof from being improved; or the CF layer needs to be arranged externally in a top-emitting OLED display emitting white light, thus degrading the integrity of the device, and hindering the display device from becoming lighter and thinner.

In view of this, how to display a full-color image while ensuring the resolution and the integrity of an OLED display is a technical problem highly desirable to be addressed in the art.

Embodiments of the disclosure provide an OLED display, a method for fabricating the same, and a display device so as to address the problem of the low integrity or resolution of OLED displays in the related art.

An embodiment of the disclosure provides an OLED display, including an underlying substrate, an organic light-emitting structural layer arranged above the underlying substrate, a touch electrode structure arranged above the organic light-emitting structural layer, and a compound encapsulation layer arranged above the underlying substrate and arranged to cover the organic light-emitting structural layer, where the touch electrode structure includes at least two electrically conductive layers, and a color filter layer which is an insulation layer arranged between the electrically conductive layers; and the compound encapsulation layer includes at least two inorganic encapsulation layers and at least one organic encapsulation layer between two of the inorganic encapsulation layers, where at least one of the inorganic encapsulation layer is located on a side of the touch electrode structure furthest away from the organic light-emitting structural layer.

In another aspect, an embodiment of the disclosure further provides a display device including an OLED display, where the OLED display includes an underlying substrate, an organic light-emitting structural layer arranged above the underlying substrate, and a touch electrode structure arranged above the organic light-emitting structural layer, and a compound encapsulation layer arranged above the underlying substrate and arranged to cover the organic light-emitting structural layer, where the touch electrode structure includes at least two electrically conductive layers, and a color filter layer which is an insulation layer arranged between the electrically conductive layers; and the compound encapsulation layer includes at least two inorganic encapsulation layers and at least one organic encapsulation layer between two of the inorganic encapsulation layers, where at least one of the inorganic encapsulation layer is located on a side of the touch electrode structure furthest away from the organic light-emitting structural layer.

In still another aspect, an embodiment of the disclosure further provides a method for fabricating an OLED display, the method including: forming an organic light-emitting structural layer arranged above an underlying substrate and a touch electrode structure arranged above the organic light-emitting structural layer, where the touch electrode structure includes at least two electrically conductive layers, and a color filter layer which is an insulation layer arranged between the electrically conductive layers; and the method further includes: forming a compound encapsulation layer arranged above the underlying substrate and arranged to cover the organic light-emitting structural layer, where, the compound encapsulation layer includes at least two inorganic encapsulation layers, and at least one organic encapsulation layer between two of the inorganic encapsulation layers, where at least one of the inorganic encapsulation layers is formed after the touch electrode structure has been formed.

In the OLED display, the method for fabricating the same, and the display device according to an embodiment of the disclosure, the color filter layer is used as the insulation layer between the electrically conductive layers in the touch electrode structure, so that the insulation layer and the color filter layer are the same film layer, thereby improving the integrity of the OLED display, and reducing the thickness of the OLED display. Also, the OLED display can be fabricated by forming the electrically conductive layers and the color filter layer in the touch electrode structure through inkjet printing, thereby preventing the organic light-emitting diode layer from being affected in an etching process. Therefore, at least one inorganic encapsulation layer can be arranged on a side of the touch electrode structure furthest away from the organic light-emitting structural layer to enable the touch electrode structure and the color filter layer to be integrated in the OLED display so as to improve the integrity of the OLED display and protect the touch electrode structure and the color filter layer from erosion and damage of external environment.

DETAILED DESCRIPTION OF AN EMBODIMENT

Figure 1A:
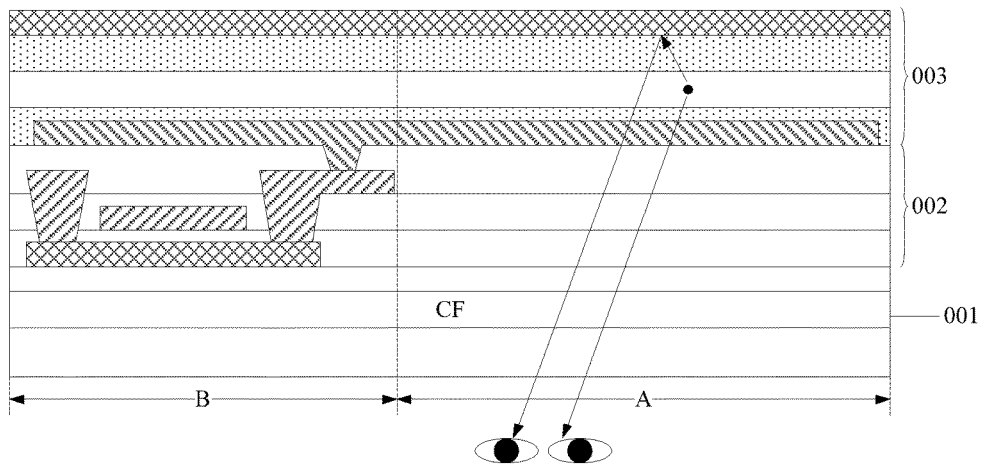
FIG. 1A is a schematic structural diagram of an OLED display in the related art.

An OLED display, a method for fabricating an OLED display, and a display device according to embodiments of the disclosure will be described below in details with reference to the drawings.

The shapes and sizes of respective film layers in the drawings are not intended to reflect a real proportion of the OLED display, but are only intended to illustrate the content of the disclosure.

In presently existing technology, when a white organic light-emitting layer and a CF layer are used to display full-color images, as the CF layer needs to be patterned in an etching process during fabrication, while material of the organic light-emitting structural layer in an OLED display is sensitive to humidity, in order to prevent the material of the organic light-emitting structural layer from being affected while the CF layer is being etched, a bottom-emitting OLED display may be adopted. As illustrated in FIG. 1A, for a bottom-emitting OLED display, first a CF layer 001 needs to be fabricated on a underlying substrate, and then an array of pixel driver circuits 002 and an organic light-emitting structural layer 003 are fabricated on the CF layer, where the organic light-emitting structural layer OLED display in FIG. 1A includes a light-emitting area A and a pixel driver circuit area B. No light can be transmitted through the pixel driver circuit area, and it is difficult to reduce the area thereof, so it is difficult to improve the resolution of the bottom-emitting OLED display, and the bottom-emitting OLED display is only applicable to TVs, inapplicable to mobile phones, particularly high-resolution mobile phones.

Figure 1B:
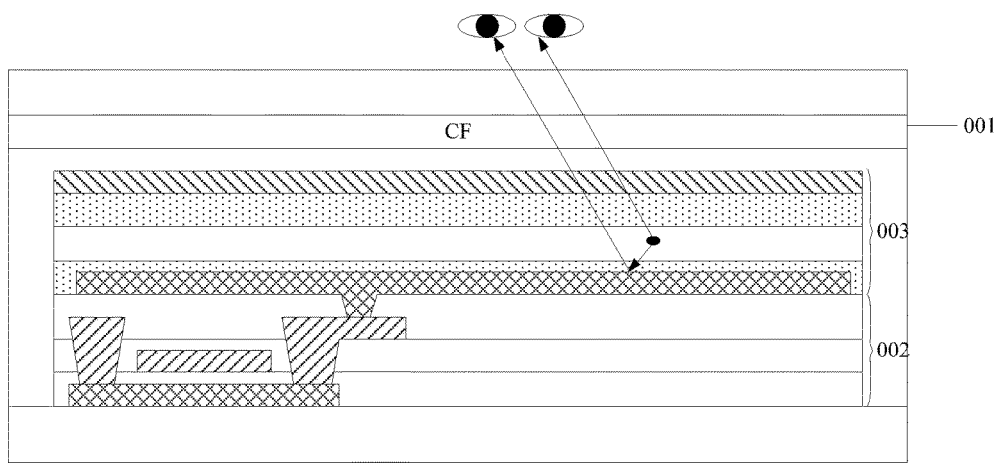
FIG. 1B is a schematic structural diagram of an OLED display in the related art.

At present, when a top-emitting OLED display is adopted to make a full-color display with a white organic light-emitting layer and a CF layer, as during fabrication, the CF layer needs to be patterned in an etching process, while the material of the organic light-emitting structural layer in the OLED display is sensitive to humidity, in order to prevent the material from being affected while the CF layer is being etched, the CF layer needs to be arranged outside the top-emitting OLED display. As illustrated in FIG. 1B, an external CF substrate is typically arranged above an encapsulation layer of a top-emitting OLED display. However, the integrity of this structure is so low that may hinder the OLED display from being lighter and thinner.

In view of present technology, how to display a full-color image while ensuring the resolution and the integrity of an OLED display is a technical problem highly desirable to be addressed in the art.

Hereupon an embodiment of the disclosure provides an OLED display as illustrated in FIG. 2 to FIG. 4D, which particularly includes an underlying substrate 100, an organic light-emitting structural layer 200 and a touch electrode structure 300 arranged in that order above the underlying substrate 100, and a compound encapsulation layer 400 arranged above the underlying substrate 100 and covering the organic light-emitting structural layer 200.

The touch electrode structure 300 includes at least two electrically conductive layers 310, and a color filter layer 320 which is an insulation layer arranged between the electrically conductive layers 310.

The compound encapsulation layer 400 includes at least two inorganic encapsulation layers 410, and at least one organic encapsulation layers 420 between two of the inorganic encapsulation layers 410, where at least one inorganic encapsulation layer 410 is located on the side of the touch electrode structure 300 away from the organic light-emitting structural layer 200.

Particularly in the above mentioned OLED display according to an embodiment of the disclosure, the color filter layer 320 is used as the insulation layer between the electrically conductive layers 310 in the touch electrode structure 300, so that the insulation layer and the color filter layer 320 are the same film layer, thereby improving the integrity of the OLED display, and reducing the thickness of the OLED display. Also, the OLED display can be fabricated by forming the electrically conductive layers 310 and the color filter layer 320 in the touch electrode structure 300 through inkjet printing, thereby preventing the organic light-emitting structural layer 200 from being affected in an etching process. Therefore, at least one inorganic encapsulation layer 410 can be arranged on the side of the touch electrode structure 300 away from the organic light-emitting structural layer 200 to enable the touch electrode structure 300 to be integrated in the OLED display so as to improve the integrity of the OLED display.

Furthermore, in the OLED display above according to an embodiment of the disclosure, the color filter layer 320 is arranged on the side of the organic light-emitting structural layer 200 away from the underlying substrate 100, thereby forming a top-emitting OLED display, which is able to prevent the resolution from being restricted by the area of the pixel driver circuits in the organic light-emitting structural layer 200, and to facilitate an improvement of the resolution of display panel, as compared with a bottom-emitting OLED display.

Figure 2:
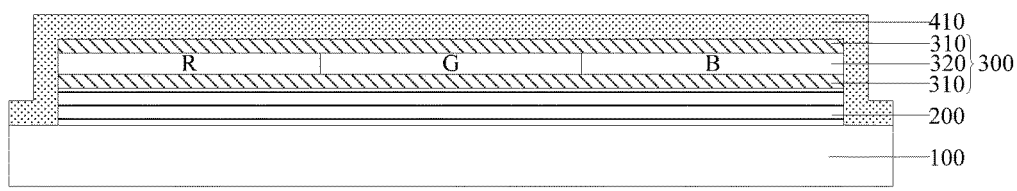
FIG. 2 is a schematic general structural diagram of an OLED display according to an embodiment of the disclosure.

In a particular implementation, in the OLED display above according to an embodiment of the disclosure, in order to enable the compound encapsulation layer 400 to encapsulate and protect the organic light-emitting structural layer 200 and the touch electrode structure 300, the compound encapsulation layer 400 needs to contact with the underlying substrate 100 to form a closed space, as illustrated in FIG. 2. This results in preventing the components in the closed space from being eroded by humidity and oxygen. FIG. 3A to FIG. 4D illustrates only a part of the OLED display structure illustrated in FIG. 2.

In a particular implementation, in the OLED display above according to an embodiment of the disclosure, the touch electrode structure 300 can detect a touch in a self-capacitive or mutual-capacitive mode, where detection principles of the self-capacitive and mutual-capacitive modes are well known in the art, so a repeated description thereof will be omitted here. The electrically conductive layers 310 in the touch electrode structure 300 are generally structured as two electrically conductive layers 310 as illustrated in FIG. 2 to FIG. 4D, but in a particular implementation, the touch electrode structure 300 can include more than two electrically conductive layers 310, although an embodiment of the disclosure will not be limited thereto. The touch electrode structure 300 including two electrically conductive layers 310 will be described below by way of an example.

In a particular implementation, in the OLED display above according to an embodiment of the disclosure, as illustrated in FIG. 3A to FIG. 3D, the touch electrode structure 300 can be arranged between the compound encapsulation layer 400 and the organic light-emitting structural layer 200, that is, components in the OLED display are structured hierarchically so that the organic light-emitting structural layer 200, the touch electrode structure 300, and the compound encapsulation layer 400 are arranged in that order on the underlying substrate 100. The electrically conductive layers 310 and the color filter layer 320 in the touch electrode structure 300 are completely protected by the compound encapsulation layer 400 for better encapsulation effect of the OLED display. In addition touch electrode signal lines of the electrically conductive layers 310 in the touch electrode structure 300 can be completely arranged in an encapsulation box defined by the compound encapsulation layer 400 and the underlying substrate 100 so that the touch electrode structure is connected with a touch circuit, thereby having the touch electrode structure 300 completely in-cell arranged, so as to facilitate better integration of the touch circuit and a display circuit.

Particularly, in the OLED display above according to an embodiment of the disclosure, if the touch electrode structure 300 is arranged between the compound encapsulation layer 400 and the organic light-emitting structural layer 200, then there may be a number of particular structures of the compound encapsulation layer 400, and as illustrated in FIG. 3A to FIG. 3D, for example, the compound encapsulation layer 400 can include two inorganic encapsulation layers 410, and an organic encapsulation layer 420 between the two inorganic encapsulation layers 410. The compound encapsulation layer 400 can further include more inorganic encapsulation layers 410 and organic encapsulation layers 420 on the basis of the structures illustrated in FIG. 3A to FIG. 3B, although an embodiment of the disclosure will not be limited thereto. Moreover, in order to guarantee a good encapsulation effect, the inorganic encapsulation layers 410 and the organic encapsulation layers 420 can be arranged alternately in the compound encapsulation layer 400, and the outmost film layer of the compound encapsulation layer 400 (i.e., the outmost film layer thereof away from the organic light-emitting structural layer 200) is generally one of the inorganic encapsulation layers 410.

Moreover, in the OLED display above according to an embodiment of the disclosure, if the touch electrode structure 300 is arranged between the compound encapsulation layer 400 and the organic light-emitting structural layer 200, in order to prevent mutual interference between the touch electrode structure 300 and the organic light-emitting structural layer 200, as illustrated in FIG. 3A to FIG. 3D, a buffer layer 500 may be added between them to act as an insulation layer.

Alternatively in another particular implementation of the OLED display above according to an embodiment of the disclosure, as illustrated in FIG. 4A to FIG. 4D, the touch electrode structure 300 can also be arranged in the compound encapsulation layer 400, that is, the touch electrode structure 300 is a part of the compound encapsulation layer 400, and can be used as a film layer in the compound encapsulation layer 400, thus facilitating an improvement in integrity of the OLED display, and a reduction in thickness of the OLED display.

Figure 4A:
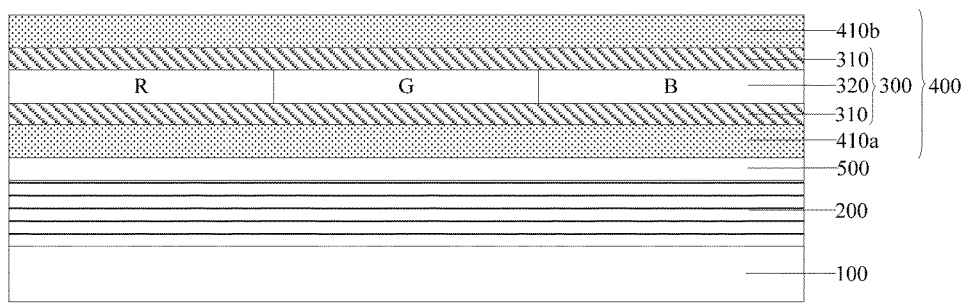
FIG. 4A illustrates a first view of a schematic structural diagram of a touch electrode structure arranged in a compound encapsulation layer in an OLED display according to an embodiment of the disclosure.

Particularly in the OLED display above according to an embodiment of the disclosure, if the touch electrode structure 300 is arranged in the compound encapsulation layer 400, then correspondingly as illustrated in FIG. 4A, the compound encapsulation layer 400 may particularly include a first inorganic encapsulation layer 410*a* arranged between the touch electrode structure 300 and the organic light-emitting structural layer 200, and a second inorganic encapsulation layer 410*b* arranged on the touch electrode structure 300 away from the first inorganic encapsulation layer 410*a*, that is, the touch electrode structure 300 is arranged between the first inorganic encapsulation layer 410a and the second inorganic encapsulation layer 410b to prevent the touch electrode structure 300 from being eroded by external humidity and oxygen.

It shall be noted that in a particular implementation, more inorganic encapsulation layers 410 and organic encapsulation layer 420 can be added to the compound encapsulation layer 400 as needed in a real design, or as illustrated in FIG. 4A to FIG. 4D. The compound encapsulation layer 400 can include only two inorganic encapsulation layers 410 (i.e., the first inorganic encapsulation layer 410a and the second inorganic encapsulation layer 410b), although an embodiment of the disclosure will not be limited thereto. If more inorganic encapsulation layers 410 are added on the side of the touch electrode structure 300 away from the organic light-emitting structural layer 200, then there may be an improved effect of protecting and encapsulating the touch electrode structure 300, but the overall thickness of the OLED display will be increased, and the overall rigidity of the modules thereof applied to a flexible display device will be increased, thus hindering the OLED display from being flexible.

Figure 4B:
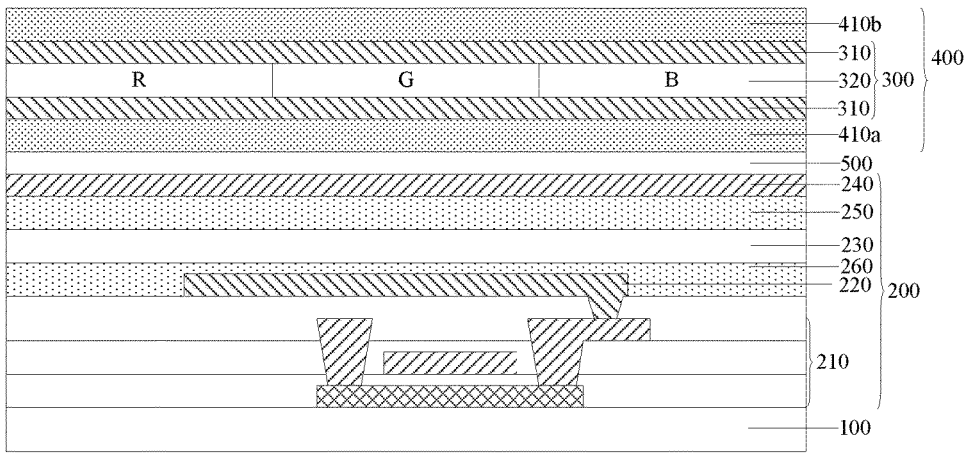
FIG. 4B illustrates a second view of a schematic structural diagram of a touch electrode structure arranged in a compound encapsulation layer in an OLED display according to an embodiment of the disclosure.
Figure 4C:
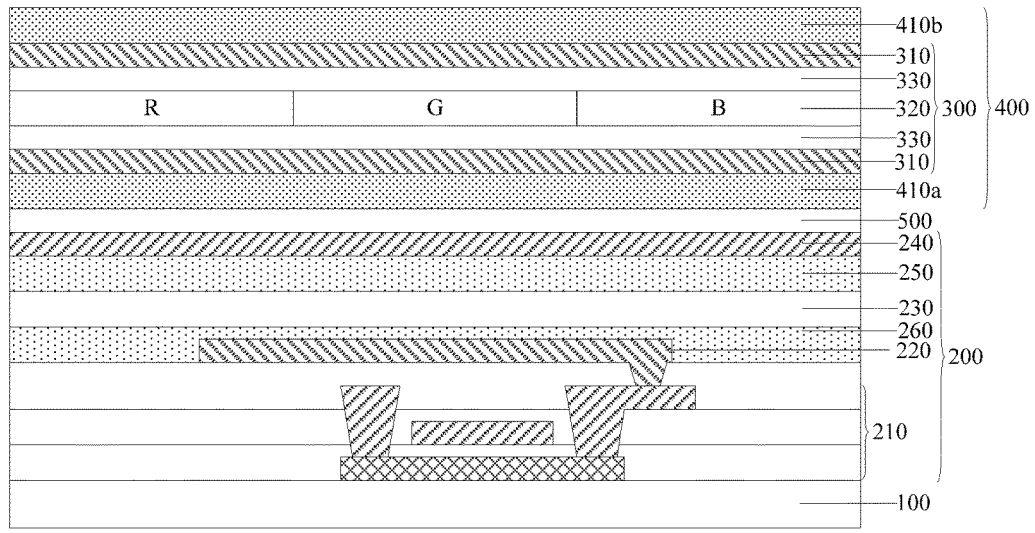
FIG. 4C illustrates a third view of a schematic structural diagram of a touch electrode structure arranged in a compound encapsulation layer in an OLED display according to an embodiment of the disclosure.
Figure 4D:
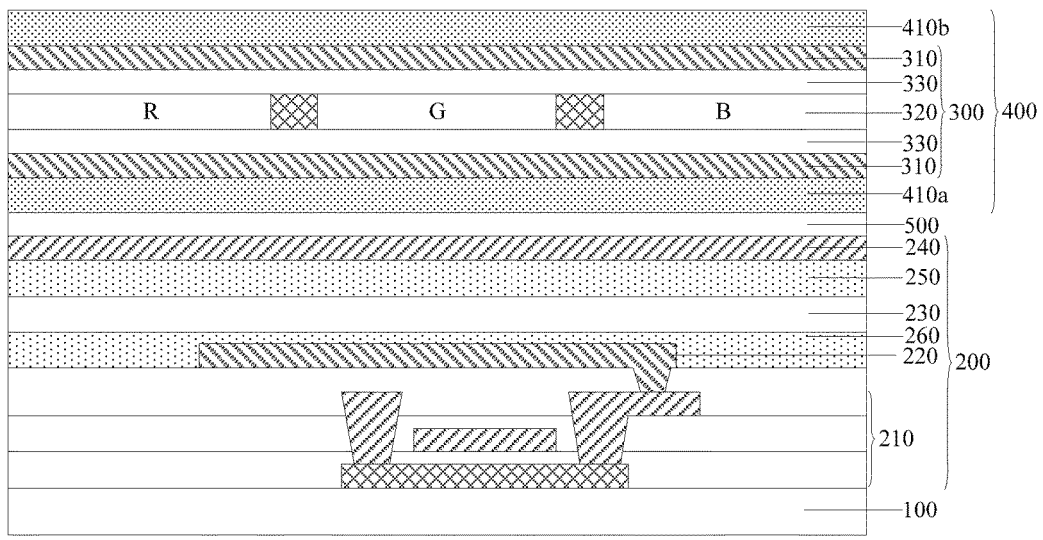
FIG. 4D illustrates a fourth view of a schematic structural diagram of a touch electrode structure arranged in a compound encapsulation layer in an OLED display according to an embodiment of the disclosure.

Moreover in the OLED display above according to an embodiment of the disclosure, if the touch electrode structure 300 is arranged in the compound encapsulation layer 400, then in order to prevent mutual interference between the first inorganic encapsulation layer 410a and the organic light-emitting structural layer 200, as illustrated in FIG. 4A and FIG. 4D, a buffer may be added between them to act as an insulation layer.

Optionally in the OLED display above according to an embodiment of the disclosure, if the touch electrode structure 300 is arranged in the compound encapsulation layer 400, then the color filter layer 320 in the touch electrode structure 300 may be used as the organic encapsulation layer 420 in the compound encapsulation layer 400, that is, the color filter layer 320 acts as the organic encapsulation layer 420 between the first inorganic encapsulation layer 410a and the second inorganic encapsulation layer 410b, so that no additional organic encapsulation layer 420 needs to be arranged in the compound encapsulation layer 400, thus facilitating an improvement in integrity of the OLED display, and a reduction in thickness of the OLED display.

Figure 3A:
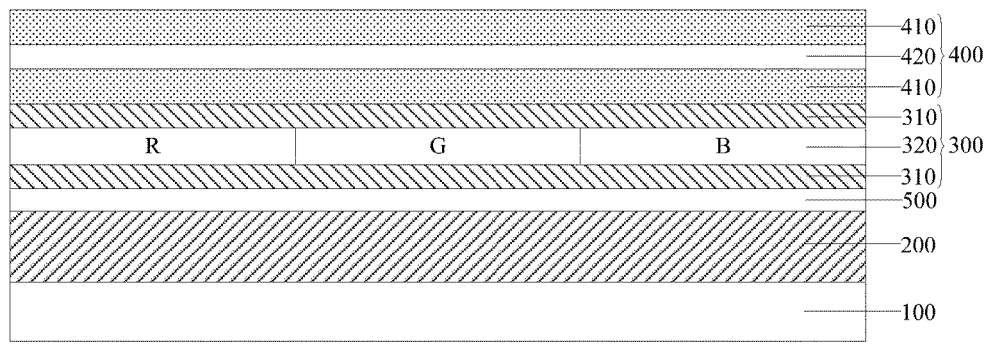
FIG. 3A illustrates a first view of a schematic structural diagram of a touch electrode structure arranged between a compound encapsulation layer and an organic light-emitting structural layer in an OLED display according to an embodiment of the disclosure.
Figure 3B:
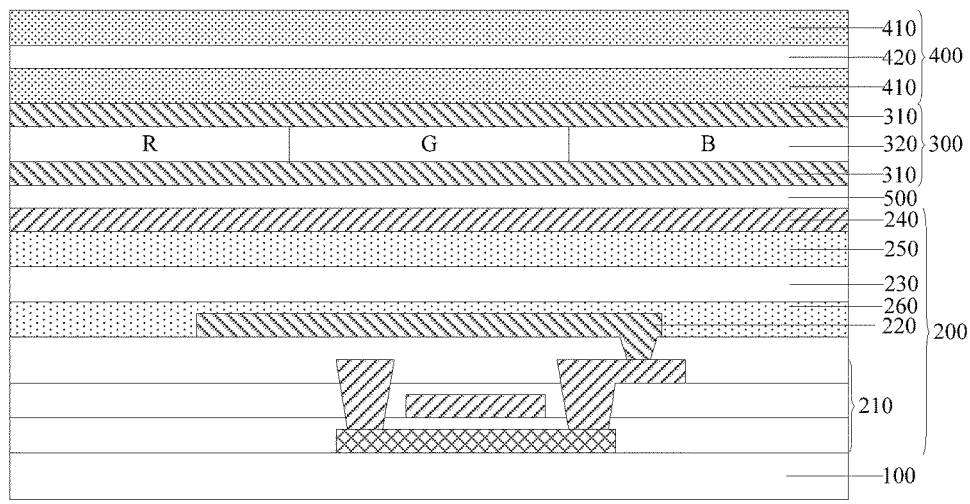
FIG. 3B illustrates a second view of a schematic structural diagram of a touch electrode structure arranged between a compound encapsulation layer and an organic light-emitting structural layer in an OLED display according to an embodiment of the disclosure.

In a particular implementation, in the OLED display above according to an embodiment of the disclosure, there may be a number of particular structures of the organic light-emitting structural layer 200, and as illustrated in FIG. 3B and FIG. 4B, for example, the organic light-emitting structural layer 200 can particularly include a pixel driver circuit 210 arranged on the underlying substrate, and an anode 220, a light-emitting layer 230, and a cathode 240 arranged in that order on the pixel driver circuit 210. Moreover in order to improve the light-emitting performance of the organic light-emitting structural layer 200, generally there is a hole transmission layer 260 between the anode 220 and the light-emitting layer 230, and an electron transmission layer 250 between the cathode 240 and the light-emitting layer 230.

Here the light-emitting layer 230 can be embodied as a white organic light-emitting layer, so that the white organic light-emitting layer covering a plurality of display elements can be fabricated through vapor plating at a time, where the spacing between respective display elements may not be determined by the organic light-emitting layer, thereby greatly narrowing the spacing between the display elements so as to facilitate an improvement in resolution of the display panel.

Furthermore in the OLED display above according to an embodiment of the disclosure, the material of an electrically conductive layer 310 is typically selected from metal, organic electrically conductive material or graphite to facilitate the formation of an electrically conductive layer 310 through inkjet printing during fabrication. For example, all or a part of patterns in an electrically conductive layer 310 can be fabricated by using metal such as gold, silver or copper, or in another example, all or a part of patterns in an electrically conductive layer 310 can be fabricated by using organic macromolecule materials such as graphite olefin or an electrically conductive polymer. In order to guarantee the insulation performance of the color filter layer 320, the material thereof is typically an organic insulation material, and the color filter layer 320 can also be formed through inkjet printing during fabrication thereof.

Figure 3C:
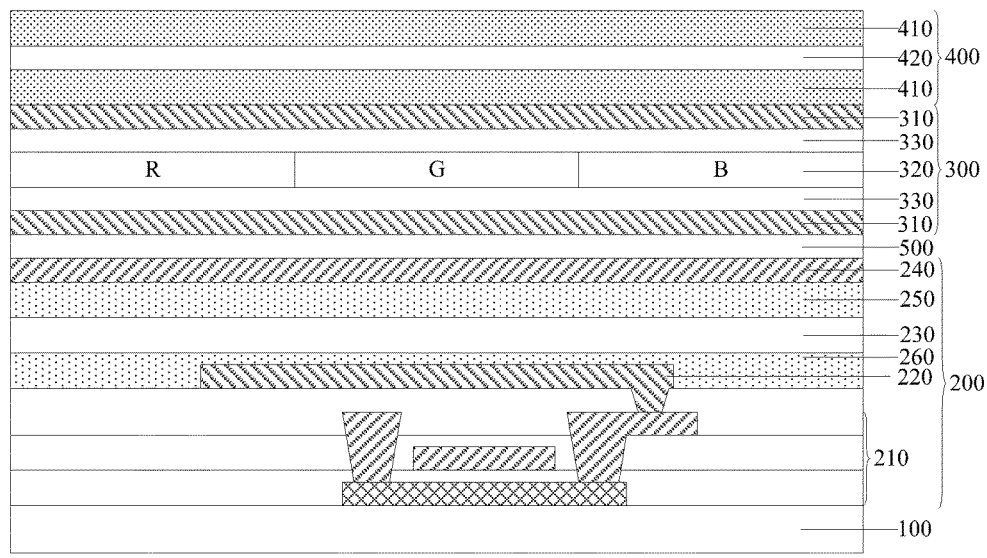
FIG. 3C illustrates a third view of a schematic structural diagram of a touch electrode structure arranged between a compound encapsulation layer and an organic light-emitting structural layer in an OLED display according to an embodiment of the disclosure.

Thus in the OLED display above according to an embodiment of the disclosure, the electrically conductive layers 310 are made of a hydrophilic inorganic material, and the color filter layer 320 is made of a hydrophobic organic material. In view of the compatibility between the color filter layer 320 and the electrically conductive layers 310, and the difficulty of their fabrication process, as illustrated in FIG. 3C and FIG. 4C, the touch electrode structure 300 can further include blocking layers 330 between the electrically conductive layers 310 and the color filter layer 320. The additional blocking layers 330 can be made of a material with hydrophilicity or hydrophobicity between that of the electrically conductive layers 310 and that of the color filter layer 320 to alleviate the problem of the compatibility between the color filter layer 320 and the electrically conductive layers 310 so as to lower the difficulty of their fabrication process.

Moreover in the OLED display above according to an embodiment of the disclosure, if the touch electrode structure 300 is arranged in the compound encapsulation layer 400, then as illustrated in FIG. 4C, a blocking layer 330 can be further used as an organic encapsulation layer 420 or an inorganic encapsulation layer 410 in the compound encapsulation layer 400. Particularly if the blocking layers 330 are made of an organic insulation material, then the blocking layers 330 may be used as organic encapsulation layers 420 in the compound encapsulation layer 400, and then there are equivalently three organic encapsulation layers 420 (two blocking film layers 330 and one color filter layer 320) arranged between the first inorganic encapsulation layer 410a and the second inorganic encapsulation layer 410b. If the blocking layers 330 are made of an inorganic insulation material, then the blocking layers 330 may be used as inorganic encapsulation layers 410 in the compound encapsulation layer 400, and then there are equivalently two inorganic encapsulation layers 410 (two blocking film layers 330) and one organic encapsulation layers 420 (the color filter layer 320) arranged between the first inorganic encapsulation layer 410a and the second inorganic encapsulation layer 410b.

Figure 3D:
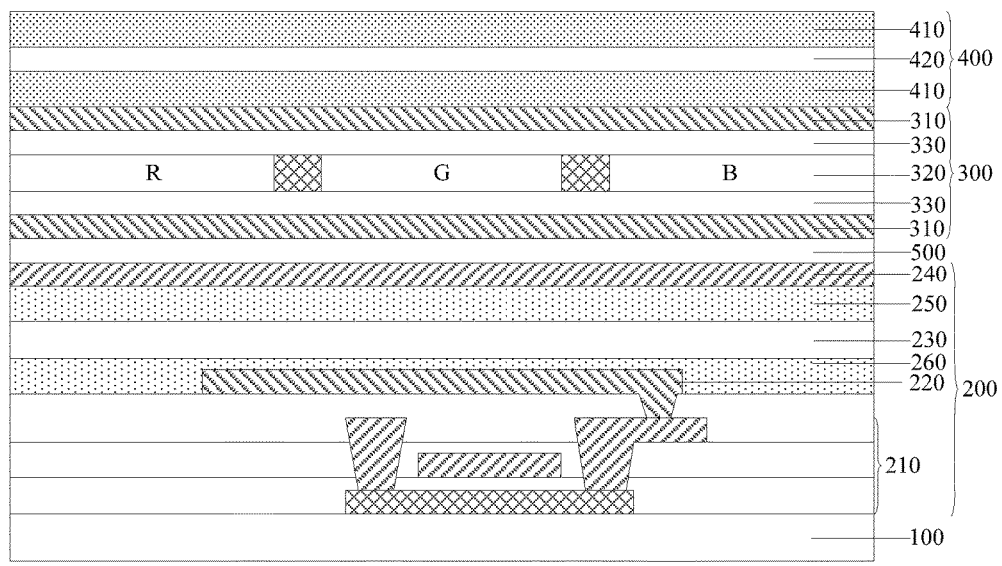
FIG. 3D illustrates a fourth view of a schematic structural diagram of a touch electrode structure arranged between a compound encapsulation layer and an organic light-emitting structural layer in an OLED display according to an embodiment of the disclosure.

In a particular implementation, in the OLED display above according to an embodiment of the disclosure, the light-emitting layer 230 in the organic light-emitting structural layer 200 as described above is a white light-emitting layer, so in order to enable the OLED display to display a colored image, as illustrated in FIG. 3D and FIG. 4D, the color filter layer 320 can particularly include a plurality of color filters R (red), G (green), and B (blue) spaced from each other, where adjacent color filters R, G, and B filter light in different colors. Although the color filter layer 320 including three types of filter colors R, G, and B is illustrated in FIG. 3D and FIG. 4D by way of an example, it may further include color filters such as a Y (yellow) color filter, as needed in a real application although an embodiment of the disclosure will not be limited thereto. Then the touch electrode structure 300 as illustrated in FIG. 3D and FIG. 4D can further include light-shielding black matrixes (areas filled in black as illustrated) among the different color filters R, G, and B to prevent color crosstalk between the respective color filters R, G, and B. In FIG. 3A to FIG. 3C, and FIG. 4A to FIG. 4C, no light-shielding black matrixes are arranged, and then the respective color filters R, G, and B are not spaced from each other, but arranged consecutively.

In a particular implementation, in the OLED display above according to an embodiment of the disclosure, the plurality of color filters R, G, and B included in the color filter layer 320 can be formed on the same film layer at the same time through inkjet printing, or the color filters R, G, and B to filter light in different colors can be formed on the same film layer sequentially through inkjet printing, although an embodiment of the disclosure will not be limited thereto. The respective color filters R, G, and B are patterned directly while the color filter layer 320 is being formed through inkjet printing, so that the performance of the underlying organic light-emitting structural layer 200 can be alleviated from being affected by the color filter layer 320 being formed as compared with the color filter layer 320 formed in the existing etching process.

Furthermore in a particular implementation, in the OLED display above according to an embodiment of the disclosure, in order to facilitate the fabrication of the color filter layer 320 through inkjet printing, patterns of the light-shielding black matrixes may be fabricated before the respective color filters R, G, and B are formed; and for good compatibility between the hydrophobic color filters R, G, and B, and the light-shielding black matrixes, the light-shielding black matrixes can particularly be made of a material which is at least partially hydrophobic. Furthermore the light-shielding black matrixes can be made of such a compound material that the light-shielding black matrixes in those areas in contact with the color filters R, G, and B are hydrophobic, and the light-shielding black matrixes in those areas in contact with the electrically conductive layers 310 are hydrophilic.

Correspondingly if the touch electrode structure 300 in the OLED display above according to an embodiment of the disclosure includes the light-shielding black matrixes, then positive projections of the light-shielding black matrixes onto the underlying substrate 100 may cover positive projections of the electrically conductive layers 310 onto the underlying substrate, that is, the patterns of the electrically conductive layers 310 are arranged in the areas of the light-shielding black matrixes, and then the electrically conductive layers 310 can be made of metal with a high electrical conductivity and a low resistance, so that the patterns of the electrically conductive layers 310 can be shielded by the light-shielding black matrixes to prevent the patterns of the electrically conductive layers 310 from being visible while alleviating ambient light from being reflected by the electrically conductive layers 310.

Figure 5A:
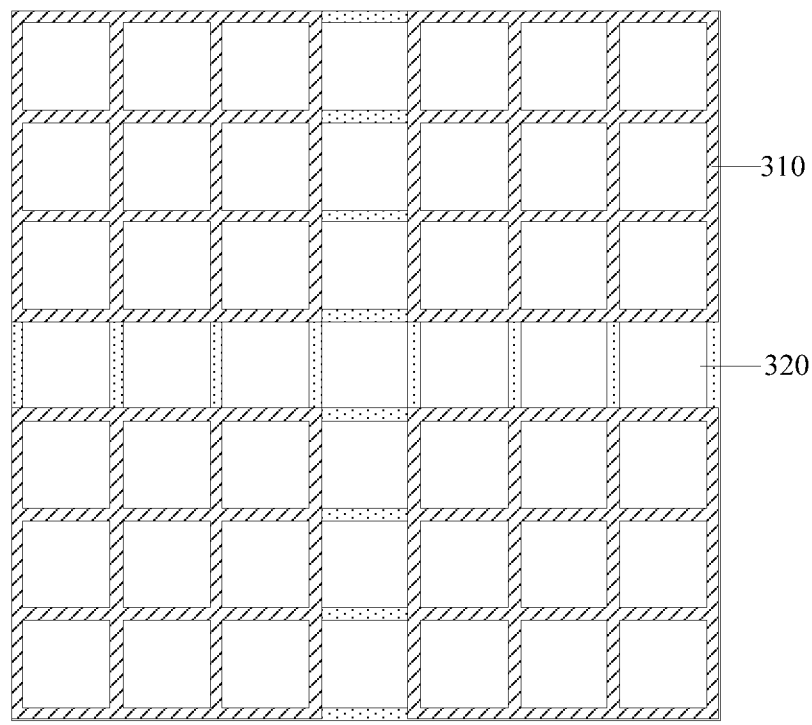
FIG. 5A illustrates a first view of a schematic structural diagram of an electrically conductive layer in an OLED display according to an embodiment of the disclosure.
Figure 5B:
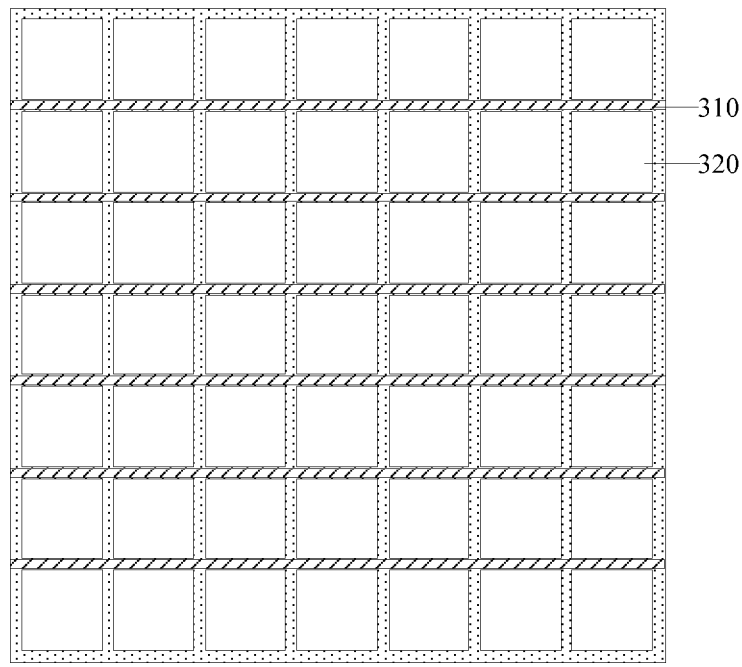
FIG. 5B illustrates a second view of a schematic structural diagram of an electrically conductive layer in an OLED display according to an embodiment of the disclosure.

In a particular implementation, in the OLED display above according to an embodiment of the disclosure, as illustrated in FIG. 5A, if the patterns of the electrically conductive layers 310 are arranged in the areas of the light-shielding black matrixes, then at least one electrically conductive layer 310 may be arranged in a grid-like structure. The patterns of the electrically conductive layers 310 will not be limited thereto, but may also be arranged in a strip-shaped electrode structure as illustrated in FIG. 5B, where the grid-like structure can facilitate a reduction in resistance of the electrically conductive layers 310, and thus a reduction in delay of a touch signal, as compared with the strip-shaped electrode structure, so the electrically conductive layers 310 in the grid-like structure are generally used in a particular implementation.

Based upon the same inventive idea, an embodiment of the disclosure further provides a method for fabricating the OLED display above, where the method includes forming an organic light-emitting structural layer and a touch electrode structure in that order on an underlying substrate, where the touch electrode structure includes at least two electrically conductive layers, and a color filter layer which is an insulation layer arranged between the electrically conductive layers.

The fabrication method above according to an embodiment of the disclosure further includes forming a compound encapsulation layer covering the organic light-emitting structural layer on the underlying substrate, where the compound encapsulation layer includes at least two inorganic encapsulation layers, and at least one organic encapsulation layer located between two inorganic encapsulation layers, where at least one inorganic encapsulation layer is formed after the touch electrode structure has been formed, that is, an inorganic encapsulation layer is lastly fabricated in the fabrication method above.

Particularly in the fabrication method above according to an embodiment of the disclosure, the color filter layer is used as the insulation layer between the electrically conductive layers in the touch electrode structure, so that the insulation layer and the color filter layer are the same film layer to reduce the number of steps to fabricate the film layers so as to improve the integrity of the OLED display, and to reduce the thickness of the OLED display.

In a particular implementation, in the fabrication method above according to an embodiment of the disclosure, the touch electrode structure can be formed particularly by forming the color filter layer and the electrically conductive layers through inkjet printing so as to also prevent the organic light-emitting diode layer from being affected in an etching process. Therefore, at least one inorganic encapsulation layer can be fabricated after the touch electrode structure has been formed to enable the touch electrode structure to be integrated in the OLED display so as to also improve the integrity of the OLED display.

Particularly the material of the electrically conductive layers is typically selected from metal, an organic electrically conductive material, or graphite to facilitate the formation thereof through inkjet printing during fabrication. For example, all or a part of patterns in the electrically conductive layers 310 can be fabricated from metal such as gold, silver or copper, or in another example, all or a part of patterns in the electrically conductive layers can be fabricated from organic macromolecule materials such as graphite olefin or an electrically conductive polymer. In order to guarantee the insulation performance of a color filter layer and that a color filter layer could be fabricated through inkjet printing, the material thereof is typically an organic insulation material.

In a particular implementation, in the fabrication method above according to an embodiment of the disclosure, the touch electrode structure is formed before the compound encapsulation layer is formed. In other words, the touch electrode structure can be arranged between the compound encapsulation layer and the organic light-emitting structural layer. And the respective components in the OLED display are formed in such an order that the organic light-emitting structural layer, the touch electrode structure, and the compound encapsulation layer are formed in that order on the underlying substrate. The electrically conductive layers and the color filter layer in the touch electrode structure are completely protected by the compound encapsulation layer for a better encapsulation effect of the OLED display. Touch electrode signal lines of the electrically conductive layers in the touch electrode structure can be completely set in an encapsulation box defined by the compound encapsulation layer. And the underlying substrate so that the touch electrode structure is connected with a touch circuit. In this way, the touch electrode structure is completely arranged in cell. so as to facilitate better integration of the touch circuit and a display circuit.

Or in another particular implementation of the fabrication method above according to an embodiment of the disclosure, the touch electrode structure is formed while forming the compound encapsulation layer, that is, the touch electrode structure is a part of the compound encapsulation layer, and can be used as a certain film layer in the compound encapsulation layer, thus facilitating an improvement in integrity of the OLED display, and a reduction in thickness of the OLED display.

Particularly in the fabrication method above according to an embodiment of the disclosure, the touch electrode structure is formed while forming the compound encapsulation layer, and correspondingly before the touch electrode structure is formed, the method can further include forming a first inorganic encapsulation layer covering the organic light-emitting structural layer on the underlying substrate; and correspondingly after the touch electrode structure is formed, the method can further include forming a second inorganic encapsulation layer covering the touch electrode structure, where the compound encapsulation layer includes the first inorganic encapsulation layer, the touch electrode structure, and the second inorganic encapsulation layer; and the color filter layer is used as an organic encapsulation layer, that is, the respective components in the OLED display are formed in such an order that the organic light-emitting structural layer, the first inorganic encapsulation layer, the touch electrode structure, and the second inorganic encapsulation layer are formed in that order on the underlying substrate.

In a particular implementation, in the fabrication method above according to an embodiment of the disclosure, the electrically conductive layers are made of a hydrophilic inorganic material, and the color filter layer is made of a hydrophobic organic material; and in view of the compatibility between the color filter layer and the electrically conductive layers, and the difficulty of their fabrication, the touch electrode structure can be further formed by forming blocking layers between the electrically conductive layers and the color filter layer. The additional blocking layers can be made of a material with hydrophilicity or hydrophobicity between that of the electrically conductive layers and that of the color filter layer to alleviate the problem of the compatibility between the color filter layer and the electrically conductive layers so as to lower the difficulty of their fabrication, that is, the components in the touch electrode structure in the OLED display are formed in such an order: the electrically conductive layer, the blocking layer, the color filter layer, the blocking layer, and the electrically conductive layer.

In a particular implementation, in the fabrication method above according to an embodiment of the disclosure, in order to enable the OLED display to display a colored image, the color filter layer generally includes a plurality of color filters spaced from each other. Particularly the plurality of color filters included in the color filter layer can be formed on the same film layer at the same time through inkjet printing, or the color filters to filter light in different colors can be formed on the same film layer sequentially through inkjet printing, although an embodiment of the disclosure will not be limited thereto. The respective color filters are patterned directly while the color filter layer is being formed through inkjet printing, so that the performance of the underlying organic light-emitting structural layer can be alleviated from being affected by the color filter layer being formed as compared with the color filter layer formed in the existing etching process.

Furthermore in a particular implementation, in the fabrication method above according to an embodiment of the disclosure, in order to prevent color crosstalk between the respective color filters, the touch electrode structure can be further formed by forming light-shielding black matrixes arranged between the different color filters before the color filters are formed.

Moreover in order to facilitate the fabrication of the color filter layer through inkjet printing, and for good compatibility between the hydrophobic color filters and the light-shielding black matrixes, the light-shielding black matrixes can particularly be made of a material which is at least partially hydrophobic. Furthermore the light-shielding black matrixes can be made of such a compound material that the light-shielding black matrixes in those areas in contact with the color filters are hydrophobic, and the light-shielding black matrixes in those areas in contact with the electrically conductive layers are hydrophilic.

Correspondingly if the touch electrode structure in the OLED display above according to an embodiment of the disclosure includes the light-shielding black matrixes, then positive projections of the light-shielding black matrixes onto the underlying substrate may cover positive projections of the electrically conductive layers onto the underlying substrate, that is, the patterns of the electrically conductive layers are arranged in the areas of the light-shielding black matrixes, and then the electrically conductive layers can be made of metal with a high electrical conductivity and a low resistance, so that the patterns of the electrically conductive layers can be shielded by the light-shielding black matrixes to prevent the patterns of the electrically conductive layers from being visible while alleviating ambient light from being reflected by the electrically conductive layers.

The respective particular steps in the fabrication method above according to an embodiment of the disclosure will be described below in details taking as an example the structures of the OLED display as illustrated in FIG. 3D and FIG. 4D respectively.

Figure 6A:
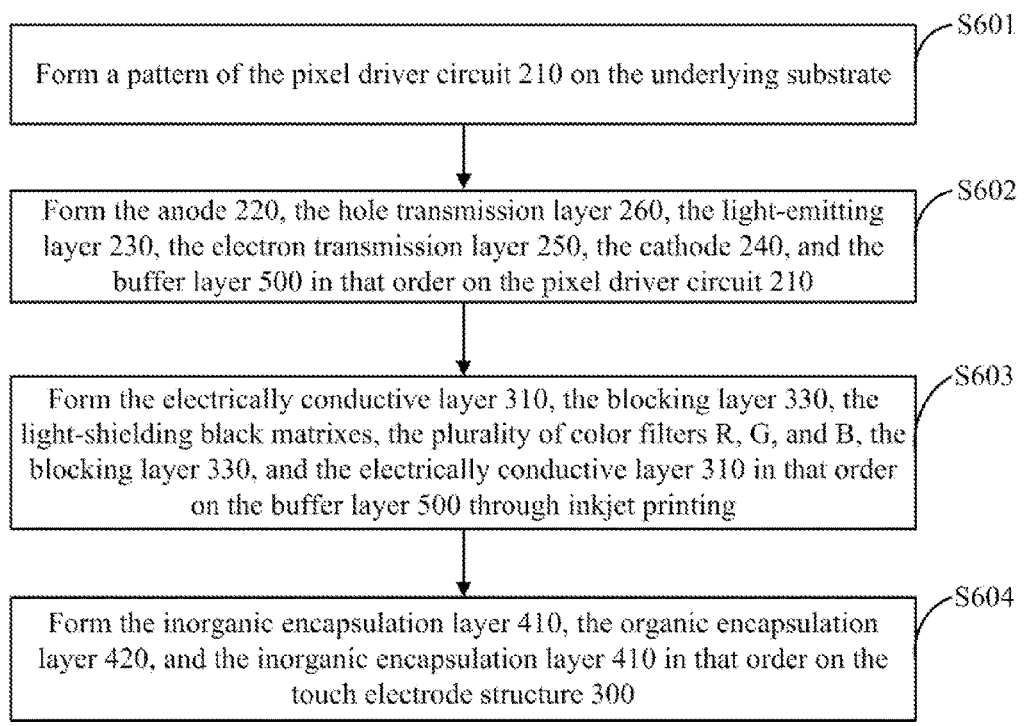
FIG. 6A illustrates a schematic flow chart of a method for fabricating an OLED display according to a first embodiment of the disclosure.

FIG. 6A illustrates an exemplary method for fabricating the OLED display as illustrated in FIG. 3D includes the following steps.

Step S601 is to form a pattern of the pixel driver circuit 210 on the underlying substrate.

Step S602 is to form the anode 220, the hole transmission layer 260, the light-emitting layer 230, the electron transmission layer 250, the cathode 240, and the buffer layer 500 in that order on the pixel driver circuit 210.

Step S603 is to form the electrically conductive layer 310, the blocking layer 330, the light-shielding black matrixes, the plurality of color filters R, G, and B, the blocking layer 330, and the electrically conductive layer 310 on the buffer layer 500 in that order through inkjet printing to constitute the touch electrode structure 300.

Step S604 is to form the inorganic encapsulation layer 410, the organic encapsulation layer 420, and the inorganic encapsulation layer 410 in that order on the touch electrode structure 300 to constitute the compound encapsulation layer 400.

Figure 6B:
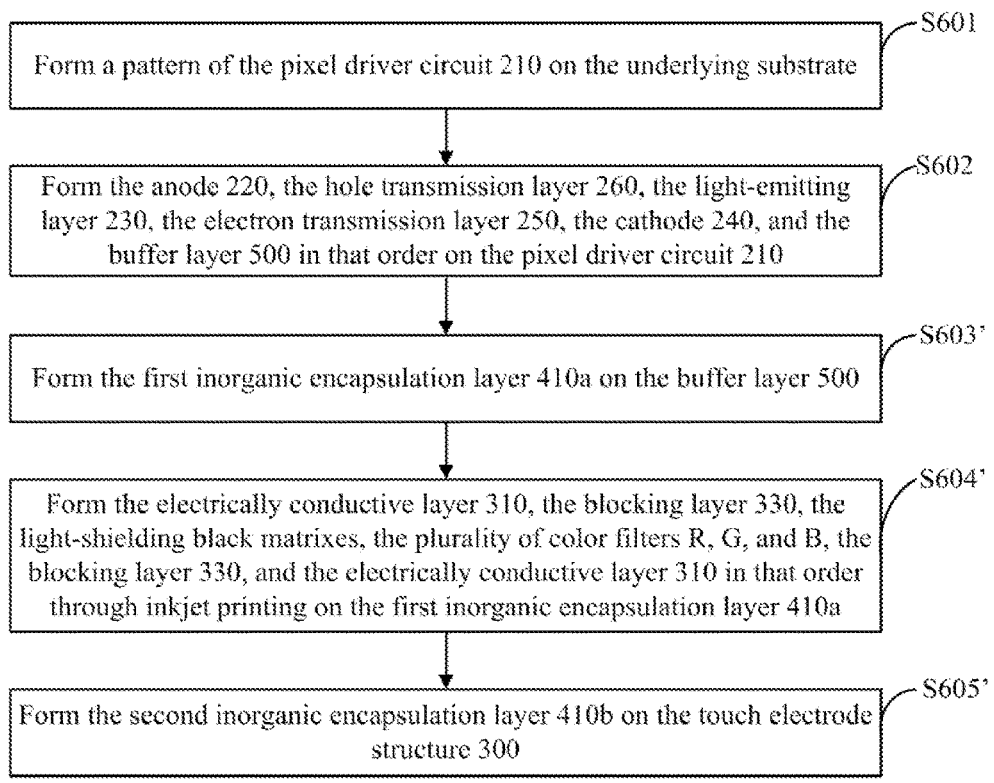
FIG. 6B illustrates a schematic flow chart of a method for fabricating an OLED display according to a second embodiment of the disclosure.

FIG. 6B illustrates an exemplary method for fabricating the OLED display as illustrated in FIG. 4D includes the following steps.

Step S601 is to form a pattern of the pixel driver circuit 210 on the underlying substrate;

Step S602 is to form the anode 220, the hole transmission layer 260, the light-emitting layer 230, the electron transmission layer 250, the cathode 240, and the buffer layer 500 in that order on the pixel driver circuit 210;

Step S603' is to form the first inorganic encapsulation layer 410a on the buffer layer 500;

Step S604' is to form the electrically conductive layer 310, the blocking layer 330, the light-shielding black matrixes, the plurality of color filters R, G, and B, the blocking layer 330, and the electrically conductive layer 310 in that order through inkjet printing on the first inorganic encapsulation layer 410a to constitute the touch electrode structure 300; and Step S605' is to form the second inorganic encapsulation layer 410b on the touch electrode structure 300.

Figure 7:
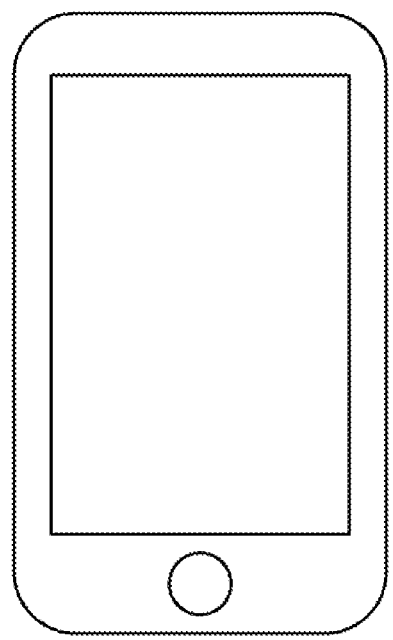
FIG. 7 is a schematic structural diagram of a display device according to an embodiment of the disclosure.

Based upon the same inventive conception, an embodiment of the disclosure further provides a display device as illustrated in FIG. 7 including the OLED display according to any one of an embodiment above of the disclosure. The display device can be any product or component capable of displaying, such as a mobile phone, a tablet, a TV set, a display, a notebook computer, a digital photo frame or a navigator. Reference can be made to an embodiment of the OLED display above for an implementation of the display device, so a repeated description thereof will be omitted here.

In the OLED display, the method for fabricating the same, and the display device according to an embodiment of the disclosure, the color filter layer is used as the insulation layer between the electrically conductive layers in the touch electrode structure, so that the insulation layer and the color filter layer are the same film layer, thereby improving the integrity of the OLED display, and reducing the thickness of the OLED display. Also, the OLED display can be fabricated by forming the electrically conductive layers and the color filter layer in the touch electrode structure through inkjet printing, thereby preventing the organic light-emitting diode layer from being affected in an etching process. Therefore, at least one inorganic encapsulation layer can be arranged on the side of the touch electrode structure away from the organic light-emitting structural layer to enable the touch electrode structure to be integrated in the OLED display so as to improve the integrity of the OLED display.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. An organic light-emitting diode display, comprising an underlying substrate, an organic light-emitting structural layer arranged above the underlying substrate, a touch electrode structure arranged above the organic light-emitting structural layer, and a compound encapsulation layer arranged above the underlying substrate and arranged to cover the organic light-emitting structural layer, wherein,
the touch electrode structure comprises at least two electrically conductive layers, and a color filter layer which is an insulation layer arranged between the electrically conductive layers, comprising a plurality of color filters spaced from each other, and a light-shielding black matrix between two of the plurality of color filters;
the compound encapsulation layer comprises at least two inorganic encapsulation layers and at least one organic encapsulation layer between two of the inorganic encapsulation layers, wherein at least one of the inorganic encapsulation layer is located on a side of the touch electrode structure furthest away from the organic light-emitting structural layer; and
a positive projection of the light-shielding black matrix onto the underlying substrate covers a positive projection of each of the electrically conductive layers onto the underlying substrate.

2. The organic light-emitting diode display according to claim 1, wherein the touch electrode structure is arranged between the compound encapsulation layer and the organic light-emitting structural layer.

3. The organic light-emitting diode display according to claim 1, wherein the touch electrode structure is arranged in the compound encapsulation layer; and
the compound encapsulation layer comprises: a first inorganic encapsulation layer arranged between the touch electrode structure and the organic light-emitting structural layer, and a second inorganic encapsulation layer arranged on the side of the touch electrode structure away from the first inorganic encapsulation layer.

4. The organic light-emitting diode display according to claim 3, wherein the color filter layer is used as one of the at least one organic encapsulation layer.

5. The organic light-emitting diode display according to claim 1, wherein the touch electrode structure further comprises blocking layers arranged between the electrically conductive layers and the color filter layer.

6. The organic light-emitting diode display according to claim 5, wherein the touch electrode structure is arranged in the compound encapsulation layer, and one of the blocking layers is used as one of the at least one organic encapsulation layer, or one of the inorganic encapsulation layers.

7. The organic light-emitting diode display according to claim 1, wherein at least one of the electrically conductive layers is arranged in a grid-like structure.

8. The organic light-emitting diode display according to claim 1, wherein each of the electrically conductive layers is made from metal, an organic electrically conductive material, or graphite.

9. The organic light-emitting diode display according to claim 1, wherein the light-shielding black matrix is at least partially hydrophobic.

10. A method for fabricating the organic light-emitting diode display according to claim 1, the method comprising:
forming an organic light-emitting structural layer arranged above a underlying substrate, and a touch electrode structure arranged above the organic light-emitting structural layer, wherein the touch electrode structure comprises at least two electrically conductive layers, and a color filter layer which is an insulation layer arranged between the electrically conductive layers and comprising a plurality of color filters spaced from each other, and wherein the touch electrode structure further comprises a light-shielding black matrix between two of the plurality of color filters; and forming a compound encapsulation layer arranged above the underlying substrate and arranged to cover the organic light-emitting structural layer; wherein, the compound encapsulation layer comprises at least two inorganic encapsulation layers, and at least one organic encapsulation layer located between two of the inorganic encapsulation layers, wherein at least one of the inorganic encapsulation layers is formed after the touch electrode structure has been formed;

a positive projection of the light-shielding black matrix onto the underlying substrate covers a positive projection of each of the electrically conductive layers onto the underlying substrate.

11. The method according to claim 10, wherein forming the touch electrode structure comprises:

forming the color filter layer and the electrically conductive layers through inkjet printing.

12. The method according to claim 10, wherein the touch electrode structure is formed before the compound encapsulation layer is formed.

13. The fabrication method according to claim 10, wherein the touch electrode structure is formed while the compound encapsulation layer is being formed; and before the touch electrode structure is formed, the method further comprises:

forming a first inorganic encapsulation layer covering the organic light-emitting structural layer on the underlying substrate; and after the touch electrode structure is formed, the method further comprises:

forming a second inorganic encapsulation layer covering the touch electrode structure;

wherein the compound encapsulation layer comprises the first inorganic encapsulation layer, the touch electrode structure, and the second inorganic encapsulation layer; and the color filter layer is used as one of the at least one organic encapsulation layer.

14. The method according to claim 10, wherein forming the touch electrode structure further comprises:

forming blocking layers arranged between the electrically conductive layers and the color filter layer.

15. The fabrication method according to claim 10, wherein forming the light-shielding black matrix comprises forming a hydrophobic part of the light-shielding black matrix.

16. A display device, comprising an organic light-emitting diode display, wherein the organic light-emitting diode display comprises an underlying substrate, an organic light-emitting structural layer arranged above the underlying substrate, a touch electrode structure arranged above the underlying substrate, and a compound encapsulation layer arranged above the underlying substrate and arranged to cover the organic light-emitting structural layer, wherein, the touch electrode structure comprises at least two electrically conductive layers, and a color filter layer which is an insulation layer arranged between the electrically conductive layers, comprising a plurality of color filters spaced from each other, and wherein the touch electrode structure further comprises a light-shielding black matrix between two of the plurality of color filters;

the compound encapsulation layer comprises at least two inorganic encapsulation layers, and at least one organic encapsulation layer between two of the inorganic encapsulation layers, wherein at least one of the inorganic encapsulation layer is located on a side of the touch electrode structure furthest away from the organic light-emitting structural layer; and a positive projection of the light-shielding black matrix onto the underlying substrate covers a positive projection of each of the electrically conductive layers onto the underlying substrate.

17. The display device according to claim 16, wherein the touch electrode structure is arranged between the compound encapsulation layer and the organic light-emitting structural layer.

18. The display device according to claim 16, wherein the touch electrode structure is arranged in the compound encapsulation layer; and the compound encapsulation layer comprises: a first inorganic encapsulation layer arranged between the touch electrode structure and the organic light-emitting structural layer, and a second inorganic encapsulation layer arranged on the side of the touch electrode structure away from the first inorganic encapsulation layer.

* * * * *